United States Patent
Baum et al.

(10) Patent No.: US 10,180,512 B2
(45) Date of Patent: Jan. 15, 2019

(54) CIRCUITS AND METHODS FOR MONITORING CURRENT IN GEOPHYSICAL SURVEY SYSTEMS

(71) Applicant: ZONGE INTERNATIONAL, INC., Tucson, AZ (US)

(72) Inventors: David Baum, Tucson, AZ (US); Scott A. Urquhart, Tucson, AZ (US); Scott C. MacInnis, Soldotna, AK (US)

(73) Assignee: ZONGE INTERNATIONAL, INC., Tucson, AZ (US)

( * ) Notice: Subject to any disclaimer, the term of this patent is extended or adjusted under 35 U.S.C. 154(b) by 205 days.

(21) Appl. No.: 15/092,441

(22) Filed: Apr. 6, 2016

(65) Prior Publication Data

US 2016/0291074 A1  Oct. 6, 2016

Related U.S. Application Data

(60) Provisional application No. 62/143,617, filed on Apr. 6, 2015.

(51) Int. Cl.
*G01R 19/28* (2006.01)
*G01V 3/02* (2006.01)

(52) U.S. Cl.
CPC .............. *G01V 3/02* (2013.01); *G01R 19/28* (2013.01)

(58) Field of Classification Search
CPC .................................. G01V 3/02; G01R 19/28
USPC ........ 324/510–515, 500, 323–368, 600, 637, 324/200, 263, 522, 713, 76.11, 324/76.69–76.77; 367/14, 15, 58, 141; 702/17
See application file for complete search history.

(56) References Cited

U.S. PATENT DOCUMENTS

| 4,720,681 A * | 1/1988 | Sinclair .................... G01V 3/38 324/233 |
| 7,091,872 B1 * | 8/2006 | Bigelow ................ G01V 3/081 323/208 |
| 2010/0213942 A1 * | 8/2010 | Lazarev ................ E21B 17/028 324/333 |
| 2011/0146984 A1 | 6/2011 | Krush ............................ 166/278 |
| 2016/0299252 A1 * | 10/2016 | Zacharko ................. G01V 3/26 |

OTHER PUBLICATIONS

Office Action issued in U.S. Appl. No. 15/656,907, dated Jan. 2, 2018 (17 pgs).

* cited by examiner

*Primary Examiner* — Melissa J Koval
*Assistant Examiner* — Trung Q. Nguyen
(74) *Attorney, Agent, or Firm* — Hayes Soloway P.C.

(57) ABSTRACT

The present disclosure provides a current monitoring circuit for monitoring current in a geophysical survey system. The circuit may be utilized in dipole-dipole systems including one or more electrode stations or in loop systems. The circuit includes a transmitter configured to generate an output current. One or more current monitors are positioned to detect current at or near the electrode stations or at positions along the one or more loops. Measured current data is transmitted back to the transmitter, which may be shut down if necessary. Methods for monitoring current in a geophysical survey system are also provided.

18 Claims, 4 Drawing Sheets

(Preferred Embodiment for Dipole-Dipole Electrodes)

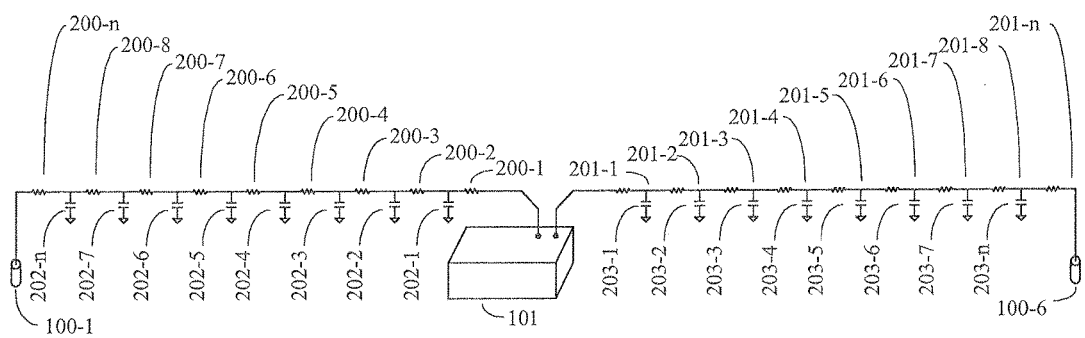
Fig. 5 (Distributed RC of the wire)
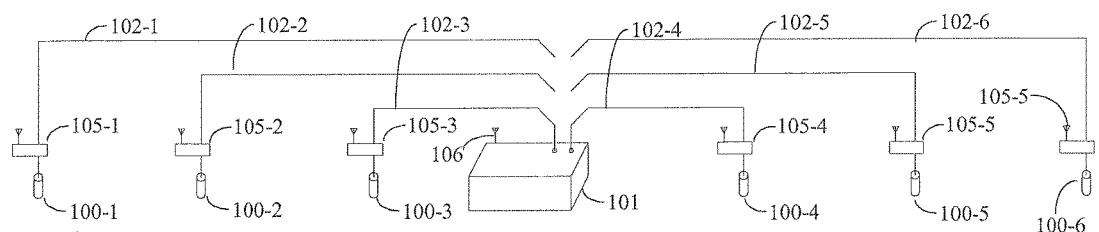
Fig. 6 (Preferred Embodiment for Dipole-Dipole Electrodes)

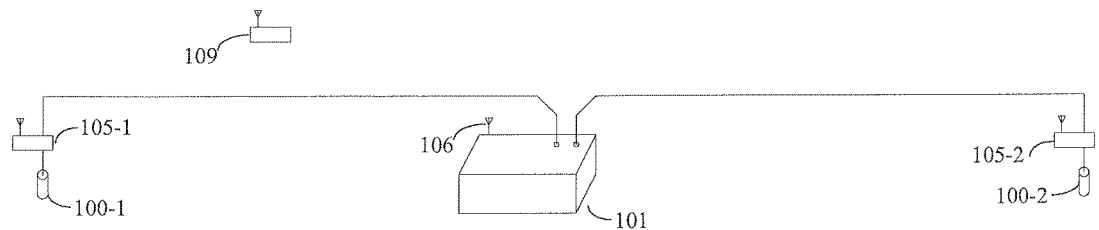
Fig. 7 (Preferred Embodiment when line of sight is not available)
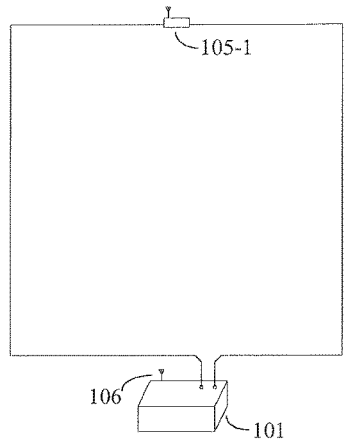
Fig. 8 (Preferred Embodiment for Magnetic Loops)
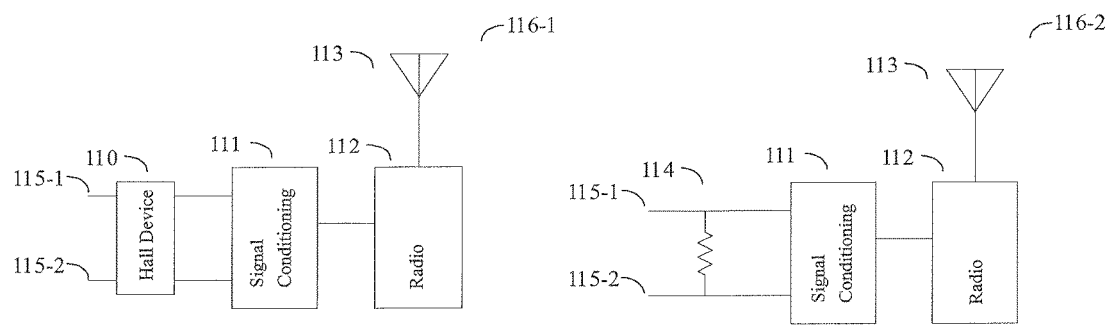
Fig. 9 (Current Monitor)

CIRCUITS AND METHODS FOR MONITORING CURRENT IN GEOPHYSICAL SURVEY SYSTEMS

CROSS REFERENCE TO RELATED APPLICATION

This application claims priority from U.S. Provisional Application Ser. No. 62/143,617, filed Apr. 6, 2015, the contents of which are incorporated herein by reference.

FIELD OF THE DISCLOSURE

The present disclosure relates generally to improved circuits and methods for protecting operating personnel, animals and non-operating persons who may come in contact with wiring used for geophysical surveys, and more particularly to circuits and methods which provide improved safety. This disclosure further provides solutions for safety problems associated with electrical geophysical transmitters.

BACKGROUND OF THE DISCLOSURE

Controlled source electromagnetic geophysical surveys, including Induced Polarization methods (frequency, time-domain and spectral), Complex Resistivity and Controlled Source Audiomagnetotellurics (CSAMT) use electrode stations usually consisting of metal stakes or conduit driven into the earth. As shown in FIGS. 1 and 3, an electrode station 100 may consist of multiple stakes, pieces of conduit, or metallic sheets connected together with wire. Insulated wire 102 is then run on the ground from each electrode station 100 to the transmitter 101. Poor wire insulation and splices, especially when the ground is wet, can cause unwanted conduction paths to ground, creating a safety issue and potentially causing problems with accurate data collection.

Referring to FIGS. 2 and 4, time domain electromagnetic methods, as well as controlled-source audio-frequency magnetotellurics use a wire loop(s) 103 to induce a magnetic field into the ground. More than one loop of wire may be used. As with dipole-dipole methods, poor wire insulation and splices 104, especially when the ground is wet, can cause unwanted conduction paths to ground, creating a safety issue and potentially causing problems with accurate data collection.

During operation, as shown in FIGS. 1-4, the voltage at the output is switched at different frequencies and duty cycles. The transmitter is able to monitor the output current. If the current is below some set point, then the transmitter output is disabled. This method is good at detecting high resistance electrodes 100, open loops 104 (e.g., broken wires), but it is not effective at detecting current following a different path to ground. Current may flow from a splice on the wire to ground or from poorly insulated wire to ground 107. Alternatively, current may flow through a person 108 or animal if they pick up or chew on the wire. These conditions are not detected by open circuit tests and other methods currently known in the art.

SUMMARY OF THE DISCLOSURE

Embodiments of the present disclosure provide a current monitoring circuit for monitoring current flow in a geophysical survey system. Briefly described, one embodiment of the current monitoring circuit, among others, can be implemented as follows. The current monitoring circuit may comprise a transmitter configured to generate an output current through one or more wires. The current monitoring circuit may further comprise at least one current monitor for monitoring current in the one or more wire.

In another embodiment, the present disclosure provides a method of measuring current flow in a geophysical survey system. The method may comprise the following steps: providing a transmitter comprising a receiver and configured to generate an output current through one or more wires; providing at least one current monitor comprising a radio and configured to measure current at one or more positions along the one or more wires; and transmitting data related to the measured current from the one or more current monitors to the transmitter.

The features, functions, and advantages that have been discussed can be achieved independently in various embodiments of the present disclosure or may be combined in yet other embodiments, further details of which can be seen with reference to the following description and drawings.

Other features, functions and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 5 shows a distributed RC network of a dipole-dipole setup of a geophysical survey.

FIG. 6 shows a preferred embodiment of a dipole-dipole setup of a geophysical survey according to the present disclosure.

FIG. 7 shows a preferred embodiment of a dipole-dipole setup of a geophysical survey when line-of-sight is not available according the present disclosure.

FIG. 8 shows a preferred embodiment of a magnetic loop setup of a geophysical survey according to the present disclosure.

FIG. 9 shows preferred embodiments of a current monitor according to the present disclosure.

DETAILED DESCRIPTION

Figure 1:
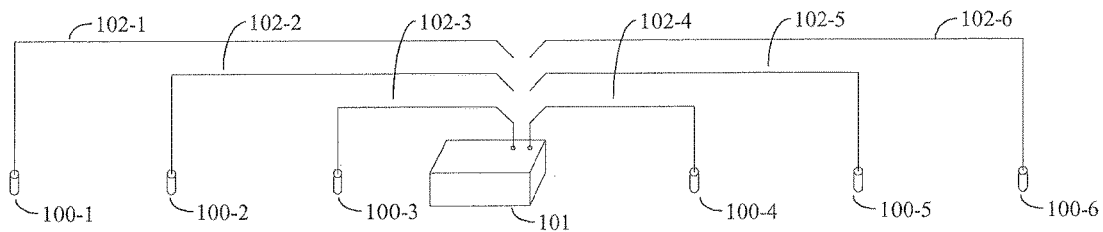
FIG. 1 shows an example of a dipole-dipole setup of a geophysical survey known in the prior art.
Figure 2:
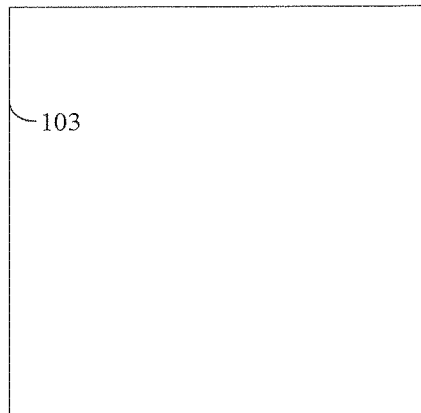
FIG. 2 shows an example of a magnetic loop setup of a geophysical survey known in the prior art.
Figure 2:
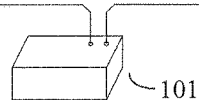
Figure 3:
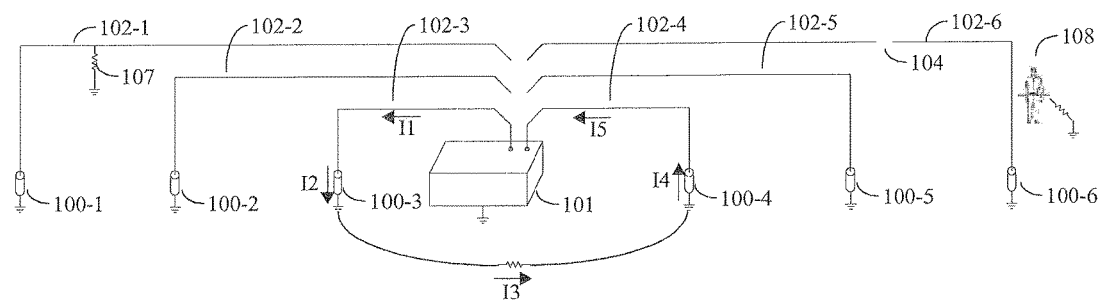
FIG. 3 shows examples of current flow disruptions in a dipole-dipole setup of a geophysical survey known in the prior art.
Figure 4:
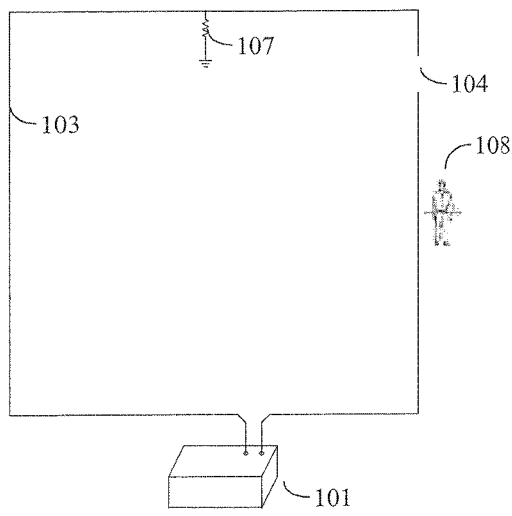
FIG. 4 shows examples of current flow disruptions in a magnetic loop setup of a geophysical survey known in the prior art.

As is shown in FIG. 5, the current flowing out of the transmitter in a dipole-dipole survey will not equal the current flowing into the ground at the dipole. This is due to the distributed resistance of the wire (200-1 to 200-$n$ and

201-1 to 201-$n$) and the distributed capacitance to ground along the wire (202-1 to 202-$n$ and 203-1 to 203-$n$).

FIG. 6 shows a preferred embodiment of a current monitoring circuit for dipole-dipole electrodes according to the present disclosure. The circuit includes a transmitter 101 comprising a radio 106 for sending and receiving data. The data will typically be sent from and/or to current monitors 105. Radio 106 may be any system for transmitting and receiving information and/or data wirelessly between the transmitter and current monitors that are known in the art. Alternatively, transmitter 101 may be configured to receive current monitoring information or data from current monitors via a wired connection, such as fiber optic cable or a system of isolation amplifiers and wire. Transmitter 101 may further include a current monitor for monitoring output current or a reference current at the transmitter. Circuitry, firmware and/or software may be included for processing and analyzing current data, including data received from current monitors 105 as well as current data obtained at the transmitter. For example, the circuitry, firmware and/or software may be configured to compare a current measured by a current monitor at an electrode station 100 to a reference current that is output by the transmitter.

The circuit further includes electrode stations 100-1-100-6. While six electrode stations are shown in the exemplary embodiment of FIG. 6, any number of electrode stations may be included in the circuit. Electrode stations 100-1-100-6 are in electrical communication with or otherwise connected to transmitter 101 via insulated transmitter wires 102-1-102-6, respectively. The number of wires included in the circuit may vary, but typically may correspond to the number of electrode stations in the circuit. The circuit further includes circuit monitors 105-1-105-6 in communication with electrode stations 100-1-100-6, respectively (as well as in communication with corresponding wires 102-1-102-6, respectively). The current monitors may be placed along the transmitter wires, typically at or near the electrode stations. The monitors may include a radio, as described below, for transmitting data or information regarding the current detected or measured by the current monitors back to transmitter 101. A radio may be any wireless system known in the art. Alternatively, a wired system or connection may be used for transmitting data to the transmitter. The current measured by the current monitors may then be compared to the output current of the transmitter or current switch. If the reported current at an electrode station is not equal to the output current of the transmitter, the voltage may be removed, thereby rendering the electrodes and/or wiring safe.

FIG. 7 shows a preferred embodiment of a current monitoring circuit according to the present disclosure that includes a repeater 109. This embodiment may be utilized, for example, when there is no line of sight (e.g. due to an obstacle or barrier or extensive distance) between transmitter 101 and current monitors 105-1 and 105-2. One or more repeaters may be used to relay information from the current monitors back to the transmitter.

FIG. 8 shows a preferred embodiment of a current monitoring circuit according to the present disclosure for a magnetic loop circuit. In this embodiment, the circuit includes a transmitter 101 and radio 106. A loop of insulated wire is connected at both ends to transmitter 101. At least one current monitor 105-1 may be placed at any location along the wire to detect or measure current.

FIG. 9 shows two possible embodiments of a current monitor that can be used in accordance with the present disclosure. Current monitors may be placed at any location in the circuit, but preferably are placed at or near electrode stations or at points distant from a transmitter in a loop or loops of a multiple loop system. In one embodiment, the current monitor 116-1 includes a Hall device 110 that detects and measures current at input current connections 115-1 and 115-2. A Hall device, also known as a Hall Effect sensor or Hall element, is well known in the art and operates based on the principles of the Hall Effect. It can detect direct and alternating currents and does not require direct contact with a wire or other element in which current is measured. Current monitor 116-1 may also comprise a signal conditioner 111, which may function to convert a detected current into transmittable information. The current monitor may further include circuitry, firmware and/or software for calculating a current, including an expected current. Current monitor 116-1 may further comprise a radio 112, which may transmit data or information about the detected current back to the transmitter, and an antenna 113.

In an alternative embodiment, also shown in FIG. 7, a current monitor 116-2 may include a non-inductive resistor 114 for detecting and measuring current at current input connections 115-1 and 115-2. The use of a resistor 114 to detect and measure current can be accomplished according to several methods known in the art, including measuring the current based on the known resistance of the resistor and the voltage drop measured across the resistor. This embodiment of a current monitor may also include a signal conditioner 111 and a radio 112, which may transmit data or information about the detected current back to the transmitter, and antenna 113. Current monitors 116-1 and 116-2 may alternatively be configured to transmit and receive data or information through any other wireless or wired system or method known in the art.

In an exemplary embodiment, the present disclosure provides a method for monitoring current in a geophysical survey system. The geophysical survey system may include a dipole-dipole system or a magnetic loop or loops. A transmitter or switch is provided for generating an output current and voltage. In a dipole-dipole system, the transmitter may be connected to one or more electrode stations via insulated wire, which carries the output current and voltage from the transmitter. In a magnetic loop system, one or more loops of insulated wire may be formed for carrying the output current and voltage from the transmitter. One or more current monitors may be provided at or near the electrode stations in the dipole-dipole system. Additional current monitors may also be positioned at points between the electrode stations and the transmitter. In a magnetic loop system, one or more current monitors may be positioned at any location along the wire loop or loops.

The current monitors are used to monitor and measure current at points away from the transmitter. Preferably, the current monitors measure current at or near the one or more electrode stations in a dipole-dipole system. Current monitors may include a Hall device, resistor, current transformer, or any other known sensor for measuring current, as well as a signal conditioner (including circuitry, firmware, software, etc.) for converting detected current into transmittable information. Current monitors also may include a system for transmitting information related to the measured current back to the transmitter in real-time. Such a system may be wireless, such as a radio with an antenna. Alternatively, such a system may be wired, such as a fiber optic cable or a system of isolation amplifiers and wire. Any wireless or wired system known in the art may be used for data transmission between the current monitors and transmitter.

The transmitter also includes a system for receiving information from the current monitors. The receiver may be configured to receive the data wirelessly. For example, the receiver may be a radio with an antenna. Alternatively, the receiver may be configured to receive the data through a wired connection, such as a fiber optic cable or a system of isolation amplifiers and wire.

The transmitter may also include circuity, firmware and/or software for processing and/or analyzing the current data received from the current monitors. For example, the transmitter may be configured to compare the received current data to an expected current, which may be calculated, or to an output current at the transmitter, which may be obtained from a separate current monitor located at the transmitter. The transmitter may further be configured to shut down or otherwise decrease or eliminate the output current and voltage in response to the processing and analysis of the received data. For example, if the received data from a current monitor reflects a current that is not equal to the expected or output current, the transmitter may completely or partially shut down. That is, all output current and voltage from the transmitter may be eliminated, or alternatively only output current or voltage to the current monitor reporting the disparate current reading may be eliminated, for example. In this manner, the safety of the geophysical survey system is enhanced. A current monitor that measures a current that is not equal or not substantially equal to the output current at the transmitter may be indicative of an unwanted conduction path to ground, including poor wire insulation and splices, wet ground, high resistance electrodes, broken wires, open loops, a person touching or otherwise interacting with the wire, and/or an animal touching, chewing on, or otherwise interacting with the wire. Such unwanted conductions paths may be dangerous because of the risk of electric shock, and accordingly, shutting down the transmitter may serve to eliminate some or all of the danger.

In addition or alternatively to shutting down the transmitter in response to data received from a current monitor, the transmitter may be configured to send an alert or notification. The alert or notification may be sent via any wired or wireless system known in the art to alert relevant personnel that there may potentially be a problem (e.g., an unwanted conduction path to ground) with the geophysical survey system. Such a notification system is not only beneficial for addressing and reducing the dangerous conditions noted above, but also for repairing the system and ensuring that the geophysical survey system is functioning properly (e.g., collecting accurate data).

In one embodiment, expected current may be measured using the following algorithm.

The current, I(x) along a horizontal wire h meters above the surface of a lossy half space can be calculated using $$I(x) = I_o e^{-ik_L|x|} + I_+ e^{-ik_L x} + I_- e^{ik_L x} \tag{1.1}$$

where $$k_L = k_0 \left\{ 1 - \frac{1}{\ln\left(\frac{2h}{a}\right)} \left[ \ln(k_1 h) + 0.07721 + i\left(\frac{\pi}{2} - \frac{4}{3}k_1 h - \frac{2}{45}(2k_1 h)^3\right) \right] \right\} \tag{1.2}$$

$$k_1 = \sqrt{\omega\mu - i\sigma} = \text{subsurface propagation constant (1/m)} \tag{1.3}$$

$$I_+ = \frac{-\Gamma_1[e^{-2ik_L L_1} - \Gamma_2 e^{-2ik_L(L_1+L_2)}]}{1 - \Gamma_1\Gamma_2 e^{-2ik_L(L_1+L_2)}} I_o \tag{1.4}$$

$$I_- = \frac{-\Gamma_2[e^{-2ik_L L_2} - \Gamma_1 e^{-2ik_L(L_1+L_2)}]}{1 - \Gamma_1\Gamma_2 e^{-2ik_L(L_1+L_2)}} I_o \tag{1.5}$$

$$I_o = I_{Tx} \frac{1 - \Gamma_1\Gamma_2 e^{-2ik_L(L_1+L_2)}}{(1 - \Gamma_1 e^{-2ik_L L_1})(1 - \Gamma_2 e^{-2ik_L L})} \tag{1.6}$$

$$\Gamma_1 = \frac{Z_{L1} - Z_c}{Z_{L1} + Z_c} \quad \Gamma_2 = \frac{Z_{L2} - Z_c}{Z_{L2} + Z_c} \quad \Gamma_c = 60\frac{k_L}{k_1}\ln\left(\frac{2h}{a}\right) \tag{1.7}$$

ω=radial frequency (radians/sec),
μ=subsurface permeability (H/m),
σ=subsurface conductivity (S/m),
a=wire radius (m),
h=wire height above ground (m)
(See also Chen, Luo & Zhang, 2008, An analytic formula of the current distribution for the VLF horizontal wire antenna above a lossy half-space, Progress in EM Research Letters, v 1, p 149-158).

It should be emphasized that the above-described embodiments of the present disclosure, particularly, any "preferred" embodiments, are merely possible examples of implementations, merely set forth for a clear understanding of the principles of the disclosure. Many other variations and modifications may be made to the above-described embodiments of the disclosure without departing substantially from the spirit and principles of the disclosure. All such modifications and variations are intended to be included herein within the scope of the present disclosure and protected by the following claims.

What is claimed is:

1. A current monitoring circuit for monitoring electrical current flow in a geophysical survey system, comprising:
   a transmitter configured to generate an output electrical current through one or more wires; and
   at least one current monitor for monitoring electrical current in the one or more wire, the at least one current monitor in communication with the transmitter, wherein the transmitter is configured to detect an unwanted conduction path to ground in the system based on the data received from the at least one current monitor.

2. The current monitoring circuit of claim 1, further comprising at least one electrode station in electrical communication with the transmitter, wherein the at least one current monitor is positioned at or near the at least one electrode station.

3. The current monitoring circuit of claim 2, wherein the transmitter is connected to the at least one electrode station by insulated wire.

4. The current monitoring circuit of claim 1, further comprising one or more loops of insulated wire connected to the transmitter, wherein the at least one current monitor is positioned along the one or more loops.

5. The current monitoring circuit of claim 1, wherein the at least one current monitor comprises a radio for wirelessly transmitting data related to the monitored electrical current to a receiver in communication with the transmitter.

6. The current monitoring circuit of claim 5, wherein the transmitter comprises at least one of circuitry, firmware and software for processing the data received from the at least one current monitor.

7. The current monitoring circuit of claim 1, further comprising fiber optic cable for transmitting data related to the monitored electrical current from the at least one current monitor to a receiver in communication with the transmitter.

8. The current monitoring circuit of claim 1, wherein the at least one current monitor comprises a Hall device or a resistor.

9. The current monitoring circuit of claim 1, wherein the at least one current monitor comprises a signal conditioner.

10. A current monitoring circuit for monitoring current flow in a geophysical survey system, comprising:
   a transmitter configured to generate an output current through one or more wires;
   at least one current monitor for monitoring current in the one or more wire, wherein the at least one current monitor comprises a radio for wirelessly transmitting data related to the monitored current to a receiver in communication with the transmitter; and
   a repeater for relaying the data from the at least one current monitor to the receiver, wherein the transmitter is configured to detect an unwanted conduction path to ground in the system based on the data received from the at least one current monitor.

11. A method of measuring electrical current flow in a geophysical survey system, comprising the following steps:
   providing a transmitter comprising a receiver and configured to generate an output electrical current through one or more wires;
   providing at least one current monitor comprising a radio and configured to measure electrical current at one or more positions along the one or more wires;
   transmitting data related to the measured electrical current from the at least one current monitor to the transmitter; and
   detecting, by the transmitter, an unwanted conduction path to ground in the system based on the data received from the at least one current monitor.

12. The method of claim 11, wherein the transmitter comprises circuitry, including at least one of firmware and software, configured to process the data received from the at least one current monitor.

13. The method of claim 12, wherein the processing comprises comparing the measure electrical current to at least one of: an expected value and an output value at the transmitter.

14. The method of claim 13, further comprising the step of shutting down the transmitter when the measured electrical current is not equal to the expected or output value.

15. The method of claim 11, wherein the geophysical survey system is a dipole-dipole system.

16. The method of claim 12, further comprising the step of providing one or more electrode stations, wherein the at least one current monitor is positioned at or near the one or more electrode stations.

17. The method of claim 11, wherein the wire is configured in one or more loops, and wherein the at least one current monitor is positioned along the one or more loops.

18. The method of claim 11, further comprising the step of providing a repeater, wherein the data is transmitted from the at least one current monitor to the transmitter by relaying the data via the repeater.

* * * * *